US012299225B2

(12) United States Patent
Komatsu et al.

(10) Patent No.: US 12,299,225 B2
(45) Date of Patent: May 13, 2025

(54) TOUCH SENSING USING POLYVINYLIDENE FLUORIDE PIEZOELECTRIC FILM

(71) Applicant: Kureha America, Inc., Houston, TX (US)

(72) Inventors: Mayu Komatsu, Houston, TX (US); Tatsuya Yaguchi, Houston, TX (US); Naomitsu Nishihata, Houston, TX (US)

(73) Assignee: Kureha America, Inc., Houston, TX (US)

( * ) Notice: Subject to any disclaimer, the term of this patent is extended or adjusted under 35 U.S.C. 154(b) by 0 days.

(21) Appl. No.: 18/177,892

(22) Filed: Mar. 3, 2023

(65) Prior Publication Data
US 2023/0280857 A1 Sep. 7, 2023

Related U.S. Application Data

(60) Provisional application No. 63/316,904, filed on Mar. 4, 2022.

(51) Int. Cl.
G06F 3/041 (2006.01)
H10N 30/00 (2023.01)
(Continued)

(52) U.S. Cl.
CPC ........ *G06F 3/04144* (2019.05); *G06F 3/0412* (2013.01); *H10N 30/302* (2023.02);
(Continued)

(58) Field of Classification Search
None
See application file for complete search history.

(56) References Cited

U.S. PATENT DOCUMENTS

2006/0293864 A1* 12/2006 Soss .................... G06F 3/04144
702/104
2009/0072670 A1* 3/2009 Hansson ............... G06F 3/0202
310/338

(Continued)

FOREIGN PATENT DOCUMENTS

EP 2267791 A2 12/2010
EP 3394714 B1 8/2019
JP H01114732 A 5/1989

OTHER PUBLICATIONS

International Search Report issued in Corresponding International Application No. PCT/US2023/014451, dated Aug. 7, 2023. (22 Pages).

*Primary Examiner* — Dorothy Harris
(74) *Attorney, Agent, or Firm* — Osha Bergman Watanabe & Burton LLP

(57) ABSTRACT

A piezoelectric sensing module includes a polyvinylidene fluoride (PVDF) piezoelectric film, a first electrode layer that includes multiple receiver electrodes arranged in a first pattern enabling a sensing of a position of an input object on a touch surface using the PVDF piezoelectric film, and a second electrode layer that includes at least one common electrode. The PVDF piezoelectric film is arranged between the first electrode layer and the second electrode layer, with the second electrode layer between the PVDF piezoelectric film and the touch surface.

20 Claims, 8 Drawing Sheets

(51) Int. Cl.
*H10N 30/30* (2023.01)
*H10N 30/857* (2023.01)

(52) U.S. Cl.
CPC ......... *H10N 30/308* (2023.02); *H10N 30/704* (2024.05); *H10N 30/857* (2023.02); *G06F 3/0416* (2013.01); *G06F 2203/04107* (2013.01)

(56) References Cited

U.S. PATENT DOCUMENTS

| | | | |
|---|---|---|---|
| 2011/0063239 A1* | 3/2011 | Xie | G06F 3/045 29/829 |
| 2013/0108061 A1 | 5/2013 | Ando et al. | |
| 2014/0139444 A1* | 5/2014 | Kauhanen | G06F 3/0447 345/173 |
| 2015/0185955 A1* | 7/2015 | Ando | G06F 3/044 345/174 |
| 2015/0331517 A1* | 11/2015 | Filiz | G06F 3/044 345/173 |
| 2016/0283006 A1 | 9/2016 | Ogura et al. | |
| 2017/0115812 A1 | 4/2017 | Lin et al. | |
| 2017/0131160 A1* | 5/2017 | Lu | G01L 5/0052 |
| 2017/0199624 A1* | 7/2017 | Nathan | G06F 3/04182 |
| 2017/0228072 A1* | 8/2017 | Amin | H10N 30/802 |
| 2017/0262099 A1* | 9/2017 | Nathan | G06F 3/0443 |
| 2019/0196549 A1* | 6/2019 | Lin | G06F 1/1652 |
| 2019/0361559 A1* | 11/2019 | Guo | H10N 30/05 |
| 2020/0220066 A1* | 7/2020 | Kim | H10N 30/857 |
| 2020/0301189 A1* | 9/2020 | Qu | G06F 3/0414 |
| 2021/0055832 A1* | 2/2021 | Bagheri | G06F 3/0445 |
| 2021/0072861 A1* | 3/2021 | Hudin | G06F 3/0488 |
| 2021/0165550 A1* | 6/2021 | Astley | G06F 3/0412 |
| 2023/0345839 A1* | 10/2023 | Yaguchi | H10N 30/878 |

\* cited by examiner

TOUCH SENSING USING POLYVINYLIDENE FLUORIDE PIEZOELECTRIC FILM

CROSS-REFERENCE TO RELATED APPLICATIONS

This patent application claims the benefit of priority under 35 U.S.C. § 119(e) to U.S. Provisional Patent Application Ser. No. 63/316,904, filed on Mar. 4, 2022. U.S. Provisional Patent Application Ser. No. 63/316,904 is incorporated by reference herein in its entirety

BACKGROUND

Input devices including touch sensor devices (e.g., touchpads or touch sensor devices) are widely used in a variety of electronic systems. A touch sensor device typically includes a sensing region, often demarked by a surface, in which the touch sensor device determines the presence, location and/or motion of one or more input objects. Touch sensor devices may be used to provide interfaces for the electronic system. For example, touch sensor devices are often used as input devices for larger computing systems (such as opaque touchpads integrated in, or peripheral to, notebook or desktop computers). Touch sensor devices may be used in different environments with unique challenges such as different types of noise, exposure to moisture, etc.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a piezoelectric sensing module, comprising: a polyvinylidene fluoride (PVDF) piezoelectric film; a first electrode layer comprising a plurality of receiver electrodes arranged in a first pattern enabling a sensing of a position of an input object on a touch surface using the PVDF piezoelectric film; and a second electrode layer comprising at least one common electrode, wherein the PVDF piezoelectric film is arranged between the first electrode layer and the second electrode layer, with the second electrode layer between the PVDF piezoelectric film and the touch surface.

In general, in one aspect, embodiments relate to a piezoelectric input device, comprising: a piezoelectric sensing module, comprising: a polyvinylidene fluoride (PVDF) piezoelectric film; a first electrode layer comprising a plurality of receiver electrodes arranged in a first pattern enabling a sensing of a position of an input object on a touch surface using the PVDF piezoelectric film, wherein the PVDF piezoelectric film and the first electrode layer are arranged below the touch surface in a stack-up that is substantially transparent; and a processing system for determining the position of the input object based on resulting signals obtained from the plurality of receiver electrodes.

In general, in one aspect, embodiments relate to a method for piezoelectric touch sensing, the method comprising: obtaining a first force signal from a piezoelectric sensing module comprising a polyvinylidene fluoride (PVDF) piezoelectric film; based on determining that an amplitude of the first force signal is above a first predetermined threshold, registering a beginning of a touch event; obtaining a second force signal; and based on determining that an amplitude of the second force signal is above a second predetermined threshold and that polarities of the first and second force signals are opposite, registering an end of the touch event.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
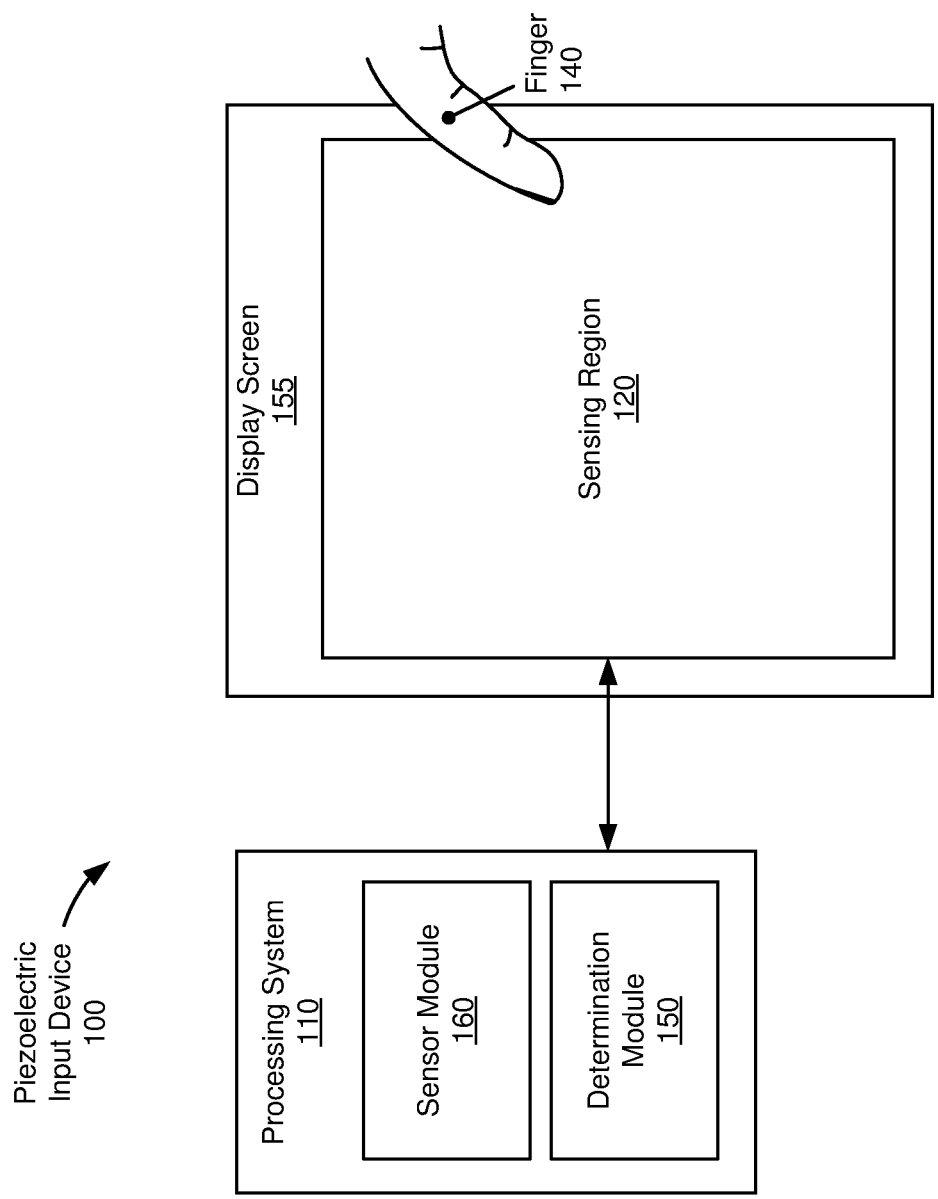
FIG. 1 shows an input device in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for touch sensing using polyvinylidene fluoride (PVDF) piezoelectric film. One or more embodiments of the disclosure enable a touch sensing that provides the location of an input object present in a sensing region of an input device that is based on piezoelectric sensing. The touch sensing may further provide an amplitude of the force applied by the input object. One or more embodiments of the disclosure do not use additional sensing technology (such as capacitive touch sensing) to determine the location of the input object. Accordingly, embodiments of the disclosure have various advantages. For example, the methods and systems as described lower cost because no additional touch sensing technology is required. Further, the methods and systems as described do not have the limitations of other touch sensing technologies. For example, in comparison to capacitive touch sensing, the methods and system using piezoelectric touch sensing are more robust to environmental influences such as moisture. Accordingly, embodiments of the disclosure are particularly suitable for wet or even underwater environments such as touch interfaces in kitchens, bathrooms, outdoor, industrial, production, and medical environments, digital signage, appliances, etc. Embodiments of the disclosure further include features that improve robustness against noise, such as high frequency noise and pyroelectric noise. The probability of erroneous touch detection (false positive and false negative) is, thus, greatly reduced. Accordingly, embodiments of the disclosure are highly suitable for safety-relevant applications such as military, aerospace, automotive, industrial, and medical applications, etc. Generally, embodiments of the disclosure are suitable for harsh environments and applications that require a high degree of reliability. A detailed description is subsequently provided.

FIG. 1 is a block diagram of an example piezoelectric input device (100), in accordance with one or more embodiments. The piezoelectric input device (100) may be configured to provide input to an electronic system (not shown). As used in this document, the term "electronic system" (or "electronic device") broadly refers to any system capable of electronically processing information. Some non-limiting examples of electronic systems include personal computers, such as desktop computers, laptop computers, tablets, machinery and medical devices with at least some degree of computing capability, etc. Further example electronic systems include peripherals, such as data input devices (including remote controls, mice, haptic input devices or sensing devices including robotic probes, hands, pressure measurement devices, etc.), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

In FIG. 1, the piezoelectric input device (100) is shown as a touch sensor device (e.g., "touchpad" or a "touch sensor device") configured to sense input provided by one or more input objects in a sensing region (120). Example input objects include styli, fingers (140), etc.

The sensing region (120) encompasses any space above, around, in and/or near the input device (100) in which the input device (100) is able to detect user input (e.g., user input provided by one or more input objects). The sizes, shapes, and locations of particular sensing regions may vary widely from embodiment to embodiment.

The input device (100) may use any combination of sensor components and technologies to detect user input in the sensing region (120). The input device (100) includes one or more sensing elements for detecting user input. The sensing elements may be piezoelectric. When a force load is applied to a piezoelectric material (e.g., a non-centrosymmetric material whose polarization moves to positive or negative direction according to the direction of the applied force), the charge balance in the piezoelectric material changes. By measuring the induced voltage, the touch event associated with the force load may be determined, and the applied force may be calculated.

Some piezoelectric implementations utilize arrays or other regular or irregular patterns of receiver electrodes to pick up the induced voltages at different locations across the piezoelectric material associated with the sensing region (120). Accordingly, a location of the touch event in the input region (120) may be determined.

In FIG. 1, a processing system (110) is shown as part of the input device (100). The processing system (110) is configured to operate the hardware of the input device (100) to detect input in the sensing region (120). The processing system (110) includes parts of or all of one or more integrated circuits (ICs) and/or other circuitry components. For example, the processing system (110) may include the circuit components discussed below in reference to FIG. 2.

In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens (155), driving haptic actuators, etc.

The processing system (110) may be implemented as a set of modules that handle different functions of the processing system (110). Each module may include circuitry that is a part of the processing system (110), firmware, software, or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, signal to noise ratio, positional and/or force information of an input object, a gesture, an action to perform based on the gesture, a combination of gestures or other information, and/or other operations.

The sensor module (160) may include functionality to determine touch events. For example, the sensor module (160) may include sensory circuitry that is coupled to receiver electrodes, as further described below. The sensor module (160) may receive one or more resulting signals from the receiver electrodes disposed on a layer of piezoelectric material. The resulting signal may include desired signals, such as components caused by an input object exerting a force in the sensing region (120), and/or undesired signals, such as noise or interference.

Although FIG. 1 shows a determination module (150) and a sensor module (160), alternative or additional modules may exist in accordance with one or more embodiments. Example alternative or additional modules include hardware operation modules for operating hardware such as sensor electrodes and display screens (155), data processing modules for processing data such as sensor signals and positional and/or force information, reporting modules for reporting information, and identification modules configured to identify gestures, such as mode changing gestures, and mode changing modules for changing operation modes. Further, the various modules may be combined in separate integrated circuits. For example, a first module may be included at least partially within a first integrated circuit and a separate module may be included at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

In some embodiments, the input device (100) includes a touch screen interface, and the sensing region (120) overlaps at least part of an active area of a display screen (155). For example, the input device (100) may include substantially transparent sensor electrodes overlaying the display screen and provide a touch screen interface for the associated electronic system. The display screen may be any type of dynamic display capable of displaying a visual interface to a user and may include any type of light emitting diode (LED), organic LED (OLED), cathode ray tube (CRT), liquid crystal display (LCD), plasma, electroluminescence (EL), or other display technology. The input device (100) and the display screen (155) may share physical elements. For example, some embodiments may utilize some of the same electrical components for displaying and sensing. In various embodiments, one or more display electrodes of a display device may be configured for both display updating and input sensing. As another example, the display screen (155) may be operated in part or in total by the processing system (110).

While FIG. 1 shows a configuration of components, other configurations may be used without departing from the scope of the disclosure. For example, various components may be combined to create a single component. As another example, the functionality performed by a single component may be performed by two or more components.

Figure 2:
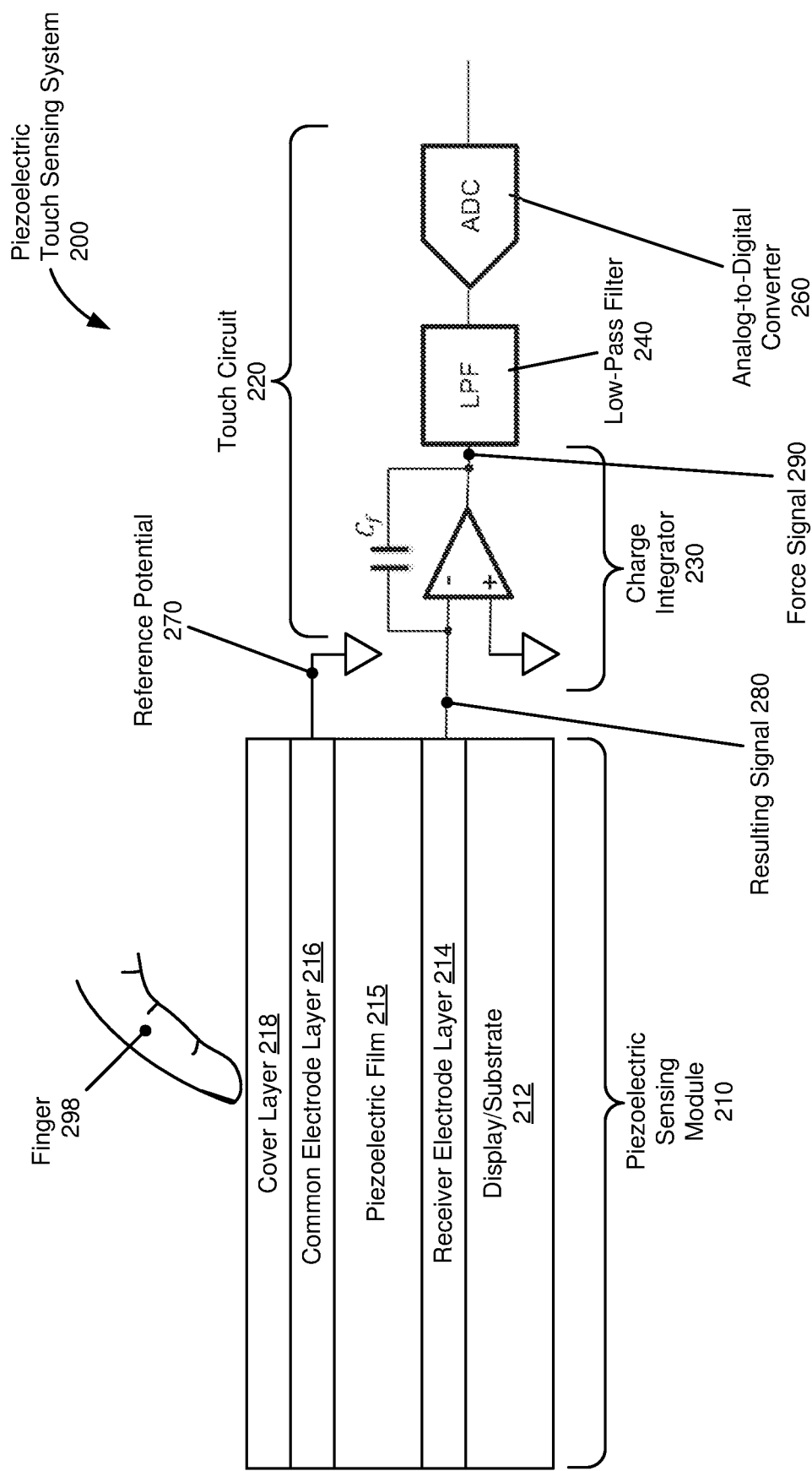
FIG. 2 shows a touch sensing system in accordance with one or more embodiments.

Turning to FIG. 2, a piezoelectric touch sensing system (200), in accordance with one or more embodiments, is shown. The piezoelectric touch sensing system (200) includes a piezoelectric sensing module (210). The piezoelectric sensing module (210) may output one or more resulting signals (280), in response to the presence or absence of touch, e.g., by a finger (298) or any other input object. The resulting signal(s) (280) may be processed by a touch circuit (220) as discussed below.

The piezoelectric sensing module (210) may be used to provide touch sensing for all or part of the sensing region (120) shown in FIG. 1. The piezoelectric sensing module (210) may also provide a display for all or part of the display screen (155). The touch circuit (220) may be a component of the processing system (110).

In one or more embodiments, the piezoelectric sensing module (210) has multiple layers including a display (212) or a substrate (if no display is present), various layers for piezoelectric touch sensing (214, 215, 216) and a cover layer (218). In one embodiment, the display (212) is an OLED display. Multiple display layers may form the display (212). For example, an OLED display may include an organic emissive layer, an anode layer, a cathode layer, one or more conductive layers which may include a thin-film transistor (TFT) layer, etc. The stack of display layers may also include a display substrate. The display substrate may be a rigid or flexible glass or plastic substrate. The display (212) may alternatively be a microLED display a TFT display or any other type of display including the corresponding layers.

In one or more embodiments, the layers for piezoelectric touch sensing (214, 215, 216) include a receiver electrode layer (214), a piezoelectric film (215), and a common electrode layer (216). The cover layer (218) may provide a touchable surface. The function of these layers is subsequently described. Additional details regarding these layers are provided in reference to FIGS. 4A-4I which show different possible stack-ups that may be used to arrange the layers.

In one or more embodiments, the receiver electrode layer (214), the piezoelectric film (215) and the common electrode layer (216) are arranged in a sandwich architecture where the piezoelectric material is in-between two layers of electrodes. Due to the piezoelectric effect associated with the piezoelectric material, when a force load is applied to the piezoelectric film (215), the charge balance across the piezoelectric film (215) changes. The change in charge balance may be registered as a voltage between a receiver electrode in the receiver electrode layer (214) and a common electrode in the common electrode layer (216). In one embodiment, the piezoelectric film is a polyvinylidene fluoride (PVDF) piezoelectric film. Other piezoelectric materials such as copolymers of PVDF may be used, without departing from the disclosure. The piezoelectric film may have certain characteristics. For example, the sensitivity (expressed as an electric charge in response to a force being applied) may be in a range of 5-40 pC/N. In order to obtain an increased signal-to-noise ratio (SNR), the sheet resistance of the PVDF piezoelectric film with the electrodes may be kept low. The sheet resistance may be 300 ohm/sq., 100 ohm/sq. or less. Also, the piezoelectric film may have any thickness, e.g., in a range of 5-200 μm. Additional layers may be added to the piezoelectric film. The additional layers may include one or more of, for example, a hard coat layer, an index matching layer, an antistatic layer, etc. A description of a piezoelectric film is provided in PCT Patent Application No. PCT/JP2021/013199. PCT/JP2021/013199 is hereby incorporated by reference in its entirety.

In one or more embodiments, the receiver electrode layer (214) and the common electrode layer (216) both include one or more electrodes configured to detect the change in the charge balance across the piezoelectric film (215). The electrodes may consist of a transparent conductive coating such as a transparent conductive oxide (TCO), e.g., indium tin oxide (ITO) or other transparent or seemingly transparent structures such as metal nanowires, carbon nanotubes, graphene, a PEDOT polymer mixture, etc. For non-transparent applications, additional electrode materials may be considered. For example, metal, inorganic oxides, carbon, conductive polymers, etc., may be used. The common electrode(s) in the common electrode layer (216) may be held on a reference potential, e.g., a signal ground, whereas the receiver electrode(s) in the receiver electrode layer (214)

may be floating relative to the reference potential, based on the charge balance across the piezoelectric film (215). In order to enable a detection of a location of the force being applied to the piezoelectric film (215), the receiver electrode layer (214) and potentially the common electrode layer (216) may include patterned electrodes. The use of patterned electrodes to detect the location of the force being applied to the piezoelectric film (215), is discussed below in reference to FIG. 3.

In one or more embodiments, the cover layer (218) provides a protective surface of the sensing display module. The cover layer (218) may be a thin glass or plastic layer with mechanical characteristics that allow transmission of a force applied by an input object (e.g., finger (298)) to the piezoelectric film (215).

In one or more embodiments, the receiver electrode layer (214), the piezoelectric layer (215), the common electrode layer (216), and the cover layer (218) are substantially transparent, thereby enabling a user to see visual content displayed by the display (212).

Figure 6:
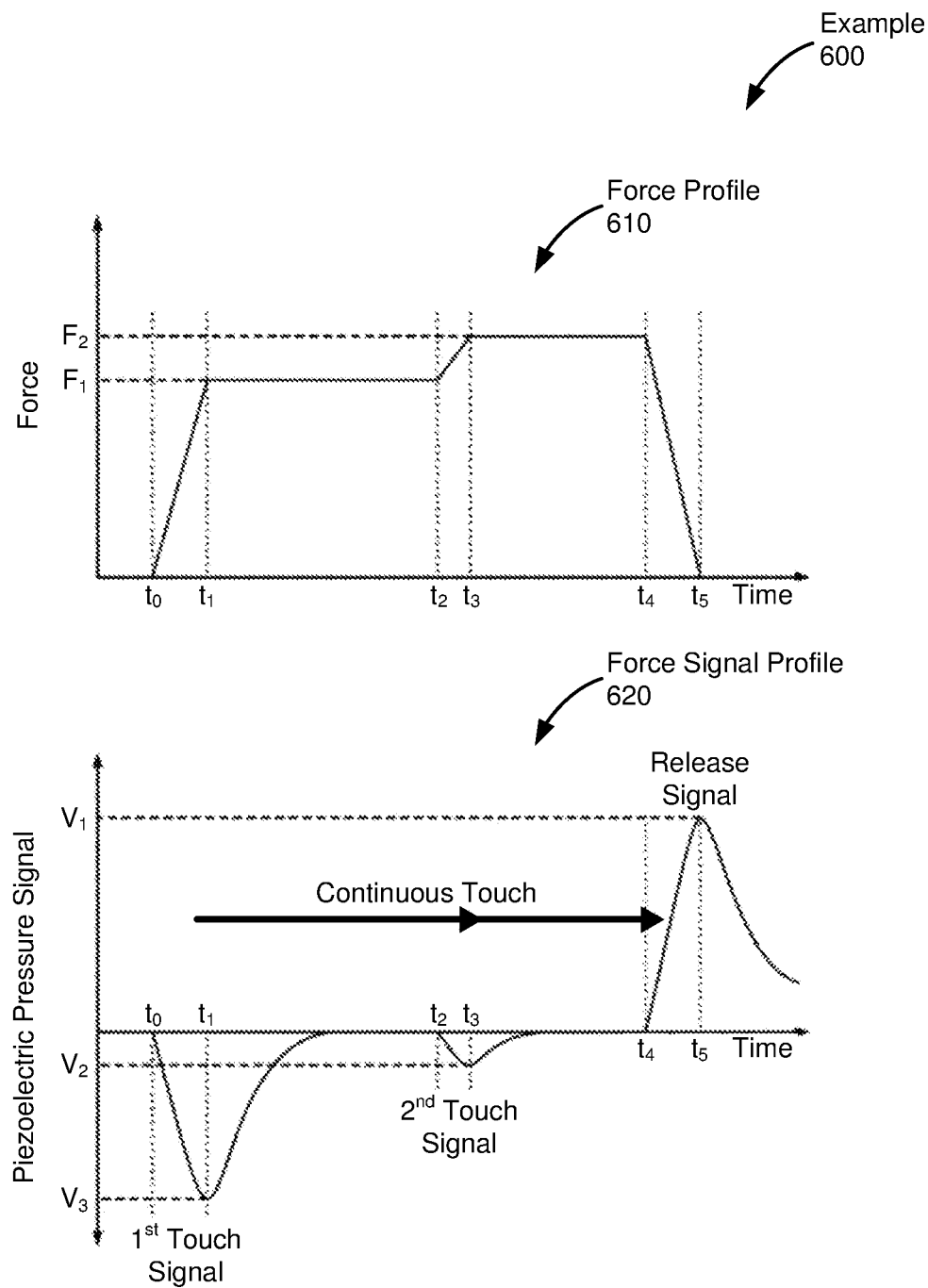
FIG. 6 shows an example in accordance with one or more embodiments.

Now referring to the touch circuit (220), in one or more embodiments, the touch circuit (220) receives a resulting signal (280) which, relative to a reference potential (270) reflects the charge balance across the piezoelectric film. In one or more embodiments, a charge integrator (230) is used to convert the measured charge balance (or change in charge balance, when a force is applied) into a voltage (force signal (290)). A low pass filter (240) may be applied to the force signal (290) to reduce or eliminate higher frequency noise on the force signal (290) and further to avoid aliasing by the analog-to-digital converter (ADC) (260). To suppress noise while avoiding interfering with actual touch events, the cutoff frequency of the filter may be set to, for example, 20 Hz, 30 Hz, or 40 Hz. Any suitable cutoff frequency may be used. Considerations for selecting the cutoff frequency may include the reduction or elimination of power supply noise, e.g., at 50 Hz or 60 Hz, and/or the elimination of other higher-frequency noise. A digital force signal, indicative of the force applied to the piezoelectric film (215) may be available at the output of the ADC (260). An example of a force signal (290) obtained in response to application of a force is shown in FIG. 6.

Figure 3B:
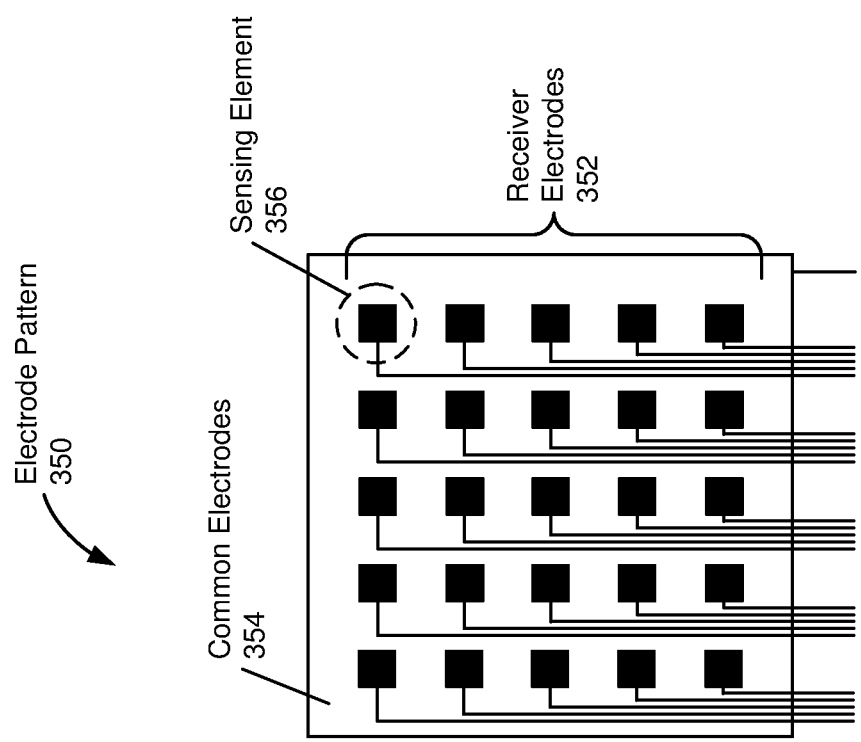
FIGS. 3A and 3B show electrode patterns in accordance with one or more embodiments.
Figure 3A:
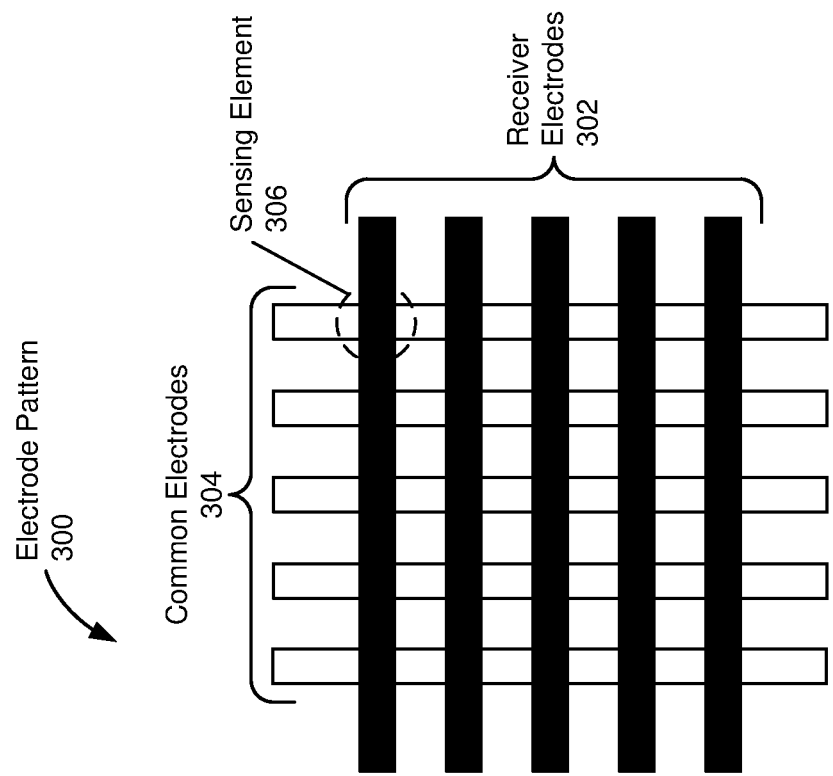

While FIG. 2 shows a single touch circuit (220), in one or more embodiments, multiple touch circuits may be used in conjunction with multiple receiver electrodes in the receiver electrode layer (214), as discussed in reference to FIGS. 3A and 3B. Alternatively, multiplexing may be used to read multiple receiver electrodes by a single touch circuit.

Turning to FIG. 3A, an electrode pattern (300) is shown. The electrode pattern includes rows of receiver electrodes (302) and columns of common electrodes (304). In the sensor pattern (300), the receiver electrodes (302) and the common electrodes (304) have rectangular shapes. The electrodes may have different shapes, without departing from the disclosure. For example, interconnected diamond-shaped electrode pads may be arranged in rows or columns. While not shown, the piezoelectric film (215) may be placed between the receiver electrodes (302) disposed on one surface of the piezoelectric film and the common electrodes (304) disposed on the other surface of the piezoelectric film.

In one embodiment, the common electrodes (304) may be set to a reference potential, e.g., a signal ground, whereas the receiver electrodes (302) are floating. A resulting signal may be obtained for each of a pair of a receiver electrode (302) and a common electrode (304), e.g., using the touch circuit (220).

At the intersection of a receiver electrode (302) and a common electrode (304), a localized voltage measurement (corresponding to the force signal (290)) may be performed to determine a local effect of a force acting on the piezo-electric film (215). The region of this localized voltage measurement may be termed a "sensing element" (306). While only a single sensing element (306) is identified in FIG. 3A, a sensing element (306) may exist at each intersection of a receiver electrode (302) and a common electrode (304). By performing a sensing operation for each of the sensing elements (306), the local effect of a force acting on the piezoelectric film (215) may, thus, be assessed across the entire (or part of) the piezoelectric film (215). The sensing operations may be performed in a scanning operation, e.g. row-by-row or column-by-column until an entire frame of sensing operations is completed. Each of the sensing operations may be performed by a touch circuit (220) as previously described. The result may be a set of force signals, each indicative of a force at a corresponding sensing element. The location at which the input object is actually applying the force to the piezoelectric element may subsequently be estimated. For example, the location may be determined to be at the sensing element with the force signal having the highest voltage or highest voltage change over time. For increased accuracy, a spatial interpolation may be performed between multiple sensing elements, based on the corresponding force signals.

Turning to FIG. 3B, an electrode pattern (350) is shown. The sensor pattern includes a pattern of receiver electrodes (352) and a single common electrode (354) spanning the region of the receiver electrodes (352). In the sensor pattern (350), each of the receiver electrodes (352) is a pad which may have any shape.

In one embodiment, the common electrodes (354) may be set to a reference potential, e.g. signal ground, whereas the receiver electrodes (352) are floating. A resulting signal may be obtained for each receiver electrode (352), e.g., using the touch circuit (220).

A sensing element (356) is formed at each of the receiver electrodes (352). While the design of the electrode pattern (350) is different from the design of the electrode pattern (300), force signals (one for each receiver electrode (352)) are obtained in a similar manner.

While FIGS. 3A and 3B show two types of electrode patterns, other types of electrode patterns may be used without departing from the disclosure. Further, electrode patterns may be scaled in size and/or resolution, without departing from the disclosure.

Turning to FIGS. 4A-4I, various examples of possible stack-ups of piezoelectric sensing modules, in accordance with one or more embodiments, are shown. The stack-ups of FIGS. 4A-4I illustrate how the previously described layers may be arranged, and further how additional layers may be included in the stack-up.

Figure 4C:
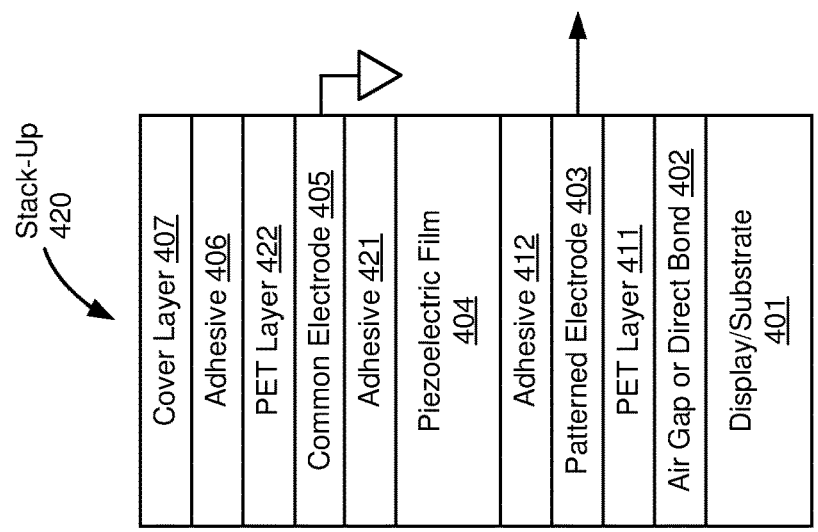
FIGS. 4A-4I show example stack-ups of a sensing display module in accordance with one or more embodiments.
Figure 4B:
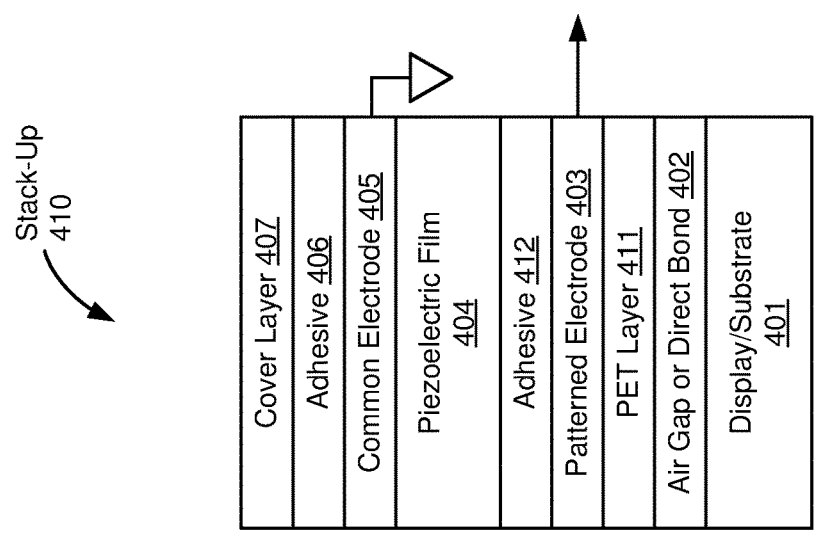
Figure 4A:
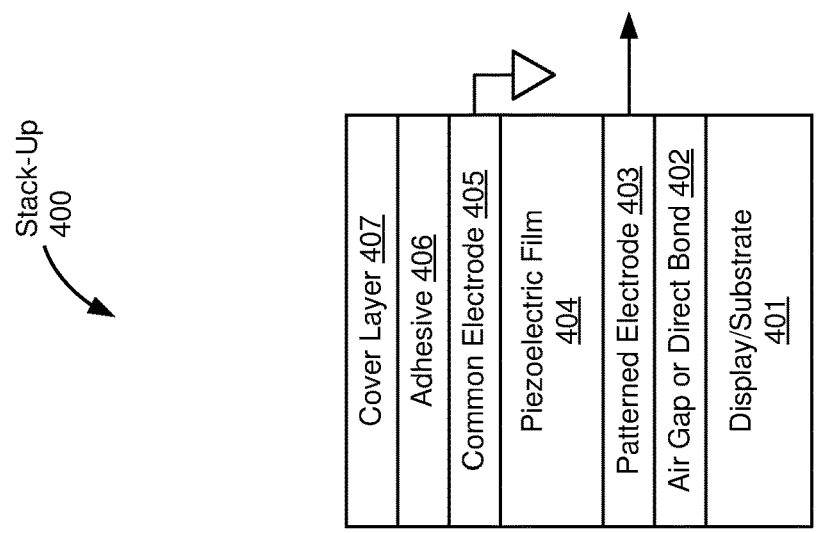

Referring to FIG. 4A, the stack-up (400) includes a display or substrate (401), a patterned electrode (403), a piezoelectric film (404), a common electrode (405), and a cover layer (407). The display or substrate (401) may be as previously described. The patterned electrode (403) may include a set of receiver electrodes as previously described. The patterned electrode (403) may be directly disposed on the piezoelectric film (404). An air gap or direct bond may be provided between the patterned electrode (403) and the display or substrate (401). The piezoelectric film (404), the common electrode (405), and the cover layer (407) may be as previously described. In the stack-up (400), the common electrode (405) is connected to a signal ground. The common electrode may be directly disposed on the piezoelectric film (404). An adhesive (406) may fasten the cover layer (407) at the top of the stack-up (400).

Referring to FIG. 4B, the stack-up (410) includes the elements of the stack-up (400) of FIG. 4A and, in addition, a polyethylene terephthalate (PET) layer (411) and an adhesive (412). The PET layer (411) may be used to facilitate the manufacturing of the piezoelectric sensing module. Specifically, the patterned electrode (403) may be disposed on the PET layer (411) instead of being disposed on the piezoelectric film (404). The adhesive (412) may permanently bond the PET layer (411) with the patterned electrode (403) to the piezoelectric film (404). The stack-up (410) may otherwise be similar to the stack-up (400).

Referring to FIG. 4C, the stack-up (420) includes the elements of the stack-up (410) of FIG. 4B and, in addition, a PET layer (422) and an adhesive (421). The PET layer (422) may be used to facilitate the manufacturing of the piezoelectric sensing module. Specifically, the common electrode (405) may be disposed on the PET layer (422) instead of being disposed on the piezoelectric film (404). The adhesive (421) may permanently bond the PET layer (422) with the common electrode (405) to the piezoelectric film (404). The stack-up (420) may otherwise be similar to the stack-up (410).

Figure 4F:
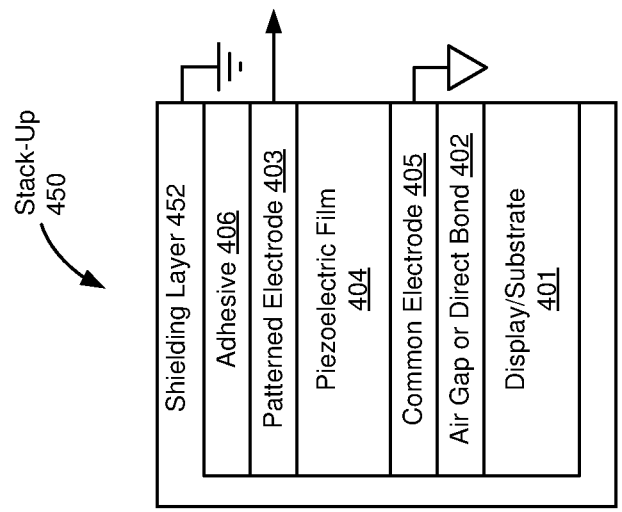
Figure 4E:
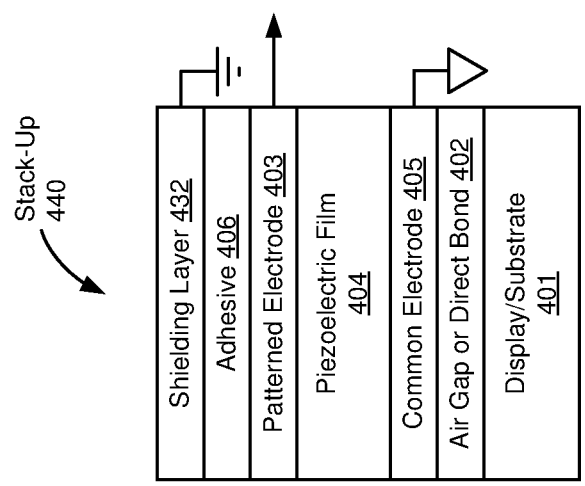
Figure 4D:
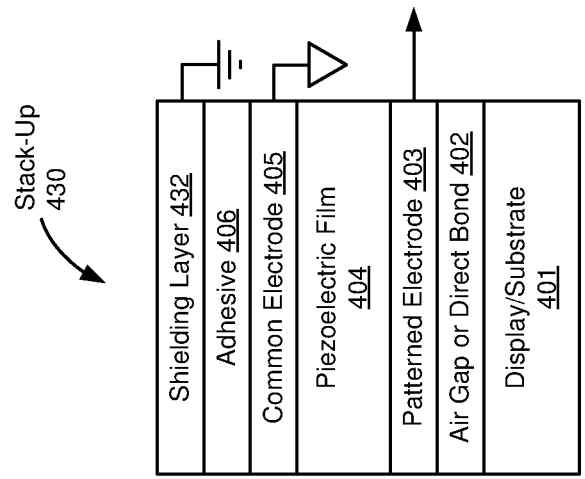

Referring to FIG. 4D, the stack-up (430) includes the elements of the stack-up (400) of FIG. 4A. However, the stack-up (430) includes a shielding layer (432) instead of the cover layer (407). The shielding layer (432) may be electrically conductive and may be connected to a ground potential, e.g., a system or device ground. The shielding layer (432) may, thus, reduce possible interference of external noise that may otherwise affect the force signal. The shielding layer (432) may have mechanical characteristics similar to the cover layer (407) and may be transparent. Unlike the cover layer (407), the shielding layer (432) may be conductive. For example, the shielding layer may include a conductive coating such as an ITO coating.

Referring to FIG. 4E, the stack-up (440) includes the elements of the stack-up (430) of FIG. 4D. However, in the stack-up (440), the locations of the patterned electrode (403) and the common electrode (405), in the stack-up, are reversed. The stack-up (440) may otherwise be similar to the stack-up (430).

Referring to FIG. 4F, the stack-up (450) includes the elements of the stack-up (440) of FIG. 4E. However, in the stack-up (450), the shielding layer (452) provides a multi-directional shielding. More specifically, the shielding layer (452), in the stack-up (452), encloses other layers (e.g., at least the patterned electrode (403), the piezoelectric film (404), and the common electrode (405)) from multiple sides. The shielding layer (452) may enclose these layers from multiple or all sides.

Figure 4I:
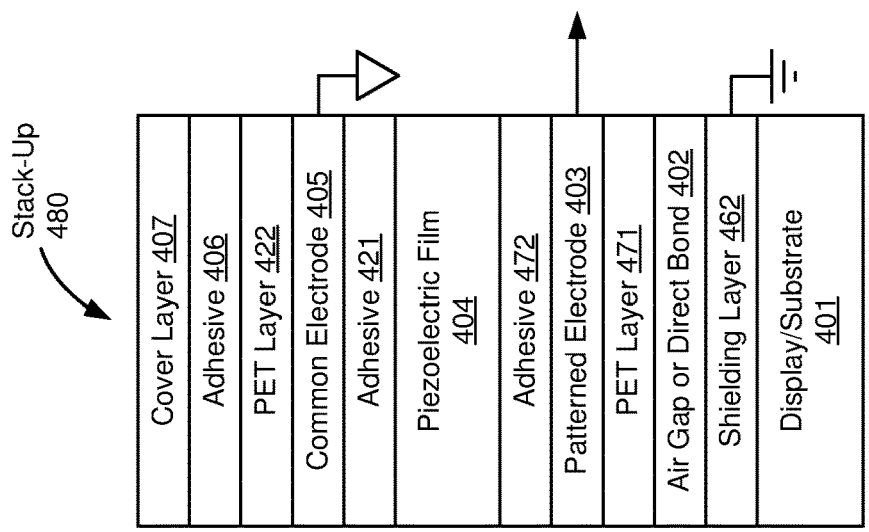
Figure 4H:
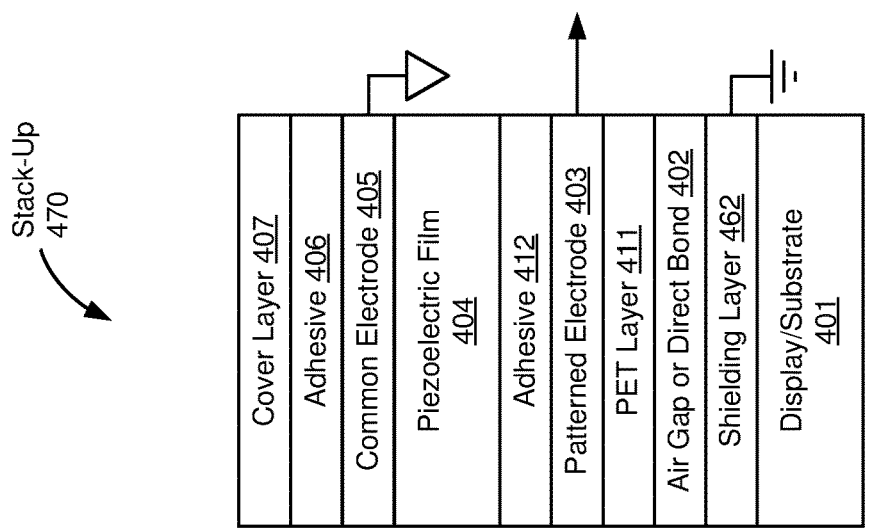
Figure 4G:
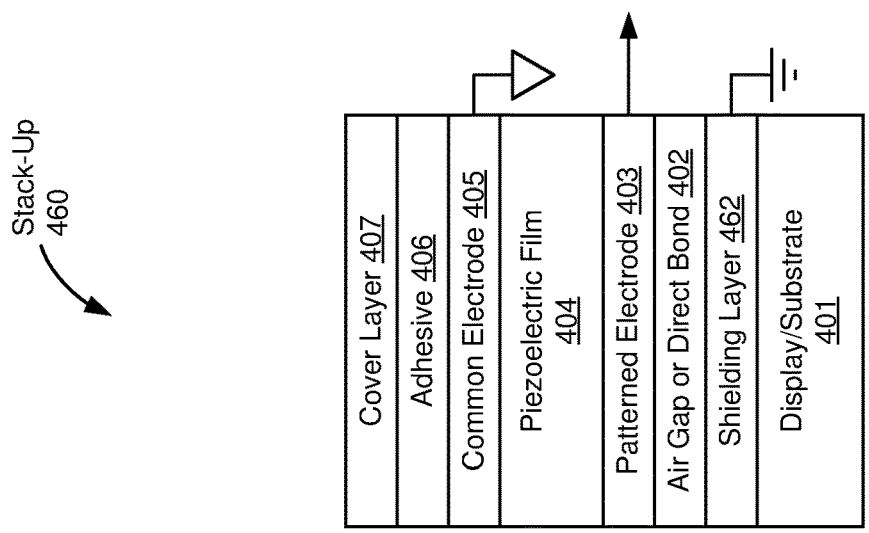

Referring to FIG. 4G, the stack-up (460) includes the elements of the stack-up (400) of FIG. 4A and, in addition, a shielding layer (462) that may block or reduce electromagnetic interference by the display (401). The shielding layer may be located between the display (401) and the layers used for the touch sensing (patterned electrode (403), piezoelectric film (404), and common electrode (405)). The shielding layer (462) may be electrically conductive and may be connected to a ground potential, e.g., a system or device ground. ITO or other conductive coatings may be used for the shielding layer (462). The shielding layer (462) may, thus, reduce possible interference of external noise that may otherwise affect the force signal. The shielding layer (432) may be transparent, to ensure visibility of the display (401).

Referring to FIG. 4H, the stack-up (470) includes the elements of the stack-up (460) of FIG. 4G and, in addition, a PET layer (411) and an adhesive (412). The PET layer (411) may be used to facilitate the manufacturing of the piezoelectric sensing module. Specifically, the patterned electrode (403) may be disposed on the PET layer (411) instead of being disposed on the piezoelectric film (404). The adhesive (412) may permanently bond the PET layer (411) with the patterned electrode (403) to the piezoelectric film (404). The stack-up (410) may otherwise be similar to the stack-up (460).

Referring to FIG. 4I, the stack-up (480) includes the elements of the stack-up (470) of FIG. 4H and, in addition, a PET layer (422) and an adhesive (421). The PET layer (422) may be used to facilitate the manufacturing of the piezoelectric sensing module. Specifically, the common electrode (405) may be disposed on the PET layer (422) instead of being disposed on the piezoelectric film (404). The adhesive (421) may permanently bond the PET layer (422) with the common electrode (405) to the piezoelectric film (404). The stack-up (480) may otherwise be similar to the stack-up (470).

While FIGS. 4A-4I shows various stack-ups, other stack-ups may be implemented without departing from the disclosure. For example, any component shown in one of the stack-ups may also be present in any of the other stack-ups.

The selection of a particular stack-up may be based on various considerations. For example, more basic stack-ups (fewer layers) may be more cost effective and/or more compact. Other stack-ups may be easier to manufacture. For example, additional PET layers may be used to support the electrodes instead of directly having the electrodes on the surfaces of the piezoelectric film. Further, certain stack-ups may be more immune to noise than others. Specifically, a shielding layer between the display and the electrode layers may reduce display interference. The placement of the common electrode toward the top of the stack-up may reduce the effect of external electromagnetic interference on the resulting signals obtained from the patterned electrode, for example, when the common electrode is connected to a system ground, an actively driven shield potential, etc. The materials in any of the stack-ups may be selected such that a high level of transparency is achieved for transparent applications. For example, the combination of a PVDF piezoelectric film and the adjacent electrode layers may have a transparency of at least 90%, at least 80%, or other levels of transparency considered sufficient for a given application. The various features and benefits provided by the stack-ups may thus be available without significantly interfering with display quality in touch-display configurations.

Also, while not specifically shown, in one or more embodiments, the stack-up includes a thermal layer. Piezoelectric materials may have a thermal drift due to pyroelectric properties of these materials. Such a thermal drift may affect the measurement of a force, e.g., when the temperature of the piezoelectric material increases during a prolonged touch by a finger. The thermal layer may be an existing layer in the stack-up (for example, the cover layer), or a dedicated layer. In order to stabilize the temperature of the piezoelectric material, the thermal layer may be placed above the piezoelectric film to provide a thermal barrier between the touch surface that may come in contact with an object having a different temperature (e.g., a finger) and the piezoelectric film. The thermal layer may be designed as a thermally insulating layer that limits transmission of heat to the piezoelectric film. Alternatively, thermal layer may be designed as a heat sink or heat spreader that absorbs heat and/or conducts heat toward other components. Thermally conductive materials that may be used include, for example, metals (such as Cu, Al), ceramics (such as AlN, $Al_2O_3$, $Si_3N_4$), graphite, etc. Thermally insulating materials that may be used include, for example, glass wool, rock wool, cellulose fiber, wool, etc. For applications requiring transparency, silica gel, aerogel, etc., may be used. Use of a thermal layer as described may reduce the presence of pyroelectric noise such that other means for addressing pyroelectric noise may be unnecessary. For example, it may be unnecessary to compensate for temperature changes using software processing.

Figure 5:
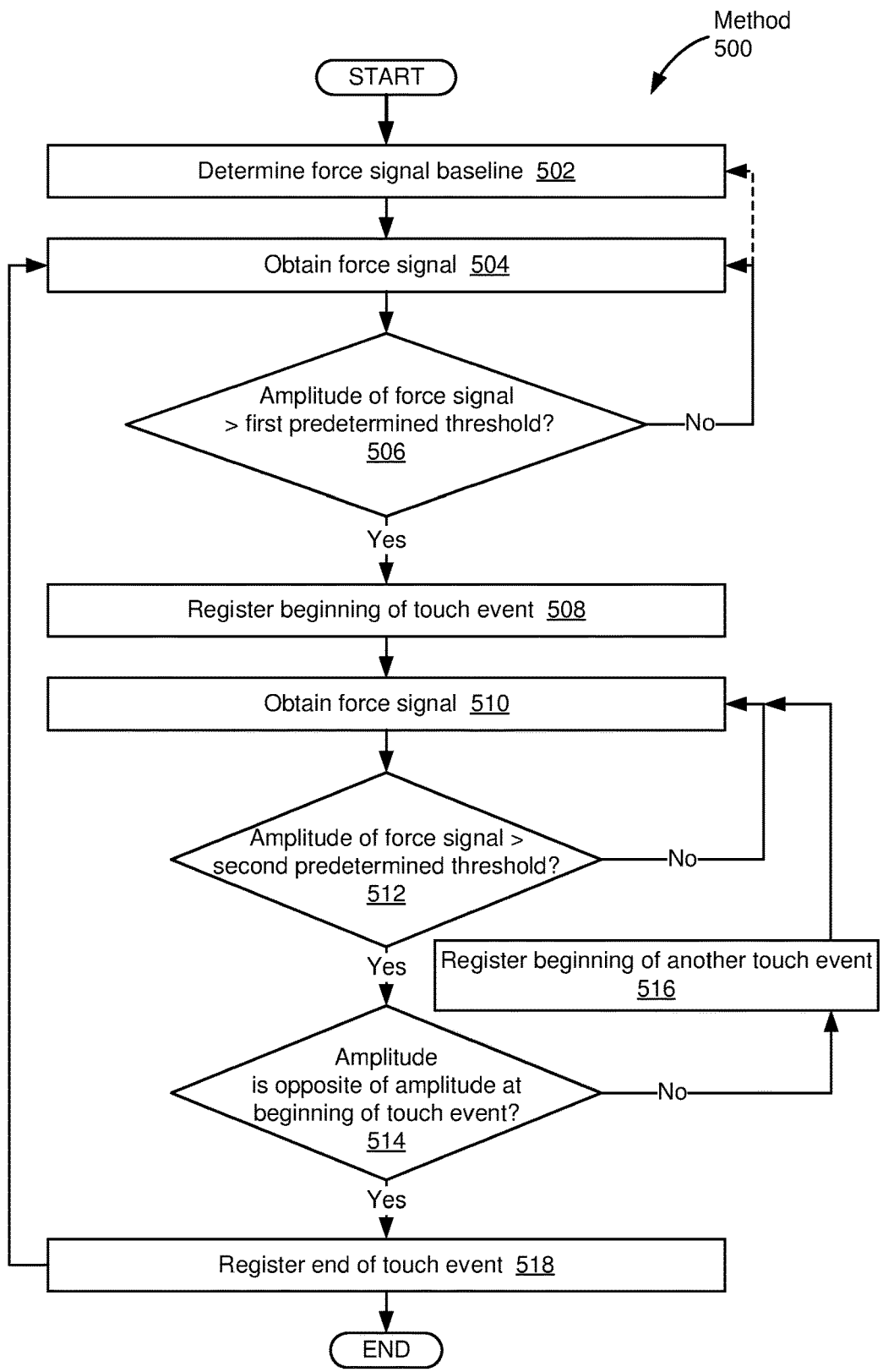
FIG. 5 shows a flowchart of a method for piezoelectric touch sensing in accordance with one or more embodiments.

FIG. 5 shows a flowchart of a method for piezoelectric touch sensing in accordance with one or more embodiments.

Execution of one or more steps in FIG. 5 may involve one or more components of the system as described in FIGS. 1, 2, 3, and 4A-4I. While the various steps in FIG. 5 are presented and described sequentially, one of ordinary skill in the art will appreciate that some or all of the blocks may be executed in different orders, may be combined or omitted, and some or all of the blocks may be executed in parallel. Furthermore, the steps may be performed actively or passively.

Turning to FIG. 5, the method (500), in one or more embodiments, operates on force signals. While not shown in FIG. 5, additional steps may be performed to obtain the force signals by performing sensing operations as previously described. These sensing operations may include obtaining a resulting signal, integrating the resulting signal by a charge integrator to obtain the force signal, and further, low-pass filter and analog-to-digital convert the force signal. The sensing operations may be performed by the components shown in FIG. 2. The sensing operations may be performed at a set rate, e.g., 10, 100, 1,000, time per second, or at any other rate. The sensing operations may be performed for any number of sensing elements, as described in reference to FIGS. 3A and 3B.

In Step 502, a force signal baseline is obtained. The force signal baseline may reflect the force signal under no-touch conditions (i.e., when no input object is present in the sensing region). A no-touch condition may be statistically detected, over time. The force baseline may be a single value, e.g., an offset voltage, or a range, e.g., a combination of an offset voltage and a standard deviation, to quantify the noise level of the force signal baseline.

In Step 504, a force signal is obtained. The obtained force signal may be the most recent force signal that becomes available during operation of the piezoelectric touch sensing system shown in FIG. 2. The force signal may be adjusted for the forces signal baseline. For example, the offset voltage may be subtracted.

In Step 506, a test is performed to determine whether the amplitude of the force signal exceeds a first predetermined threshold. The first predetermined threshold may be set such that it may be used to distinguish a touch event from other events that would be considered noise. Accordingly, a lower threshold may be suitable if the force baseline indicates a low baseline noise, whereas a higher threshold may be necessary if the baseline noise is higher. If the amplitude of the force signal exceeds the first predetermined threshold, the execution of the method may proceed with Step 508. Alternatively, if the amplitude of the force signal does not exceed the first predetermined threshold, the execution of the method may continue by returning to Step 504 to obtain a new force signal or to Step 502 to determine a new force signal baseline. The execution of Step 506 is illustrated in the example shown in FIG. 6.

In Step 508, the beginning of the touch event is registered, based on the force signal exceeding the first predetermined threshold. In other words, it is concluded that a touch is present in the sensing region of the piezoelectric input device.

In Step 510, a force signal is obtained. Step 510 may be performed analogous to Step 504.

In Step 512, a test is performed to determine whether the amplitude of the force signal exceeds a second predetermined threshold. Similar to the first predetermined threshold, the second predetermined threshold may be set under consideration of the baseline noise. If the amplitude of the force signal exceeds the second predetermined threshold, the execution of the method may proceed with Step 514. Alternatively, if the amplitude of the force signal does not exceed the first predetermined threshold, the execution of the method may continue by returning to Step 510 to obtain a new force signal. The execution of Step 512 is illustrated in the example shown in FIG. 6.

In Step 514, a test is performed to determine the polarity of the force signal (i.e., it is determined whether the amplitude of the force signal is positive or negative). If the polarity of the force signal is identical to the polarity of the force signal that resulted in the beginning of the touch event (Step 508), the method may proceed with the execution of Step 516. Otherwise, the method may proceed with the execution of Step 518.

In Step 516, the beginning of another touch event is registered. This touch event may be a result of the touch force having increased. An illustration is provided below in reference to FIG. 6.

In Step 518, the end of the touch event is registered, based on the force signal exceeding the second predetermined threshold and the polarity of the force signal obtained in Step 510 being the reverse of the polarity of the force signal obtained in Step 504. In other words, it is concluded that the touch event that began with the execution of Step 508 is ending. If multiple touch events have been detected (e.g., after execution of Step 516), the multiple touch events may be considered terminated, based on the execution of Step 518.

Steps 502-518 may be repeatedly performed, e.g., in a loop, to enable a continuous detection of touch events, over time.

While the described steps are for the detection of touch events, other steps may be performed. For example, steps may be performed to determine a location of the detected touch in the sensing region, and/or to determine a force amplitude of the detected touch.

Turning to FIG. 6 an example of a detection of a touch event, in accordance with one or more embodiments, is shown. The example (600) is based on a force profile (610) which shows a force as it may be applied by an input object in a sensing region, over time. Between time $t_0$ and $t_1$, the force increases from 0 to $F_1$, which may correspond to a finger beginning to touch a piezoelectric input device in a sensing region. The force remains constant until $t_2$. This may correspond to the finger continuing to touch the piezoelectric input device. Between $t_2$ and $t_3$, the force increases to $F_2$, as the touch by the finger intensifies. The force remains constant until $t_4$, and between $t_4$ and $t_5$ the force decreases to 0 as the touch by the finger ends.

The example (600) also includes a force signal profile (620). The force signal profile (620) corresponds to the force signal (i.e., the voltage) obtained by the piezoelectric input device during the exposure to the force profile (610). The force signal obtained from the piezoelectric material responds with a prominent downward transient to the initial touch. Referring back to FIG. 5, the downward transient exceeds the first predetermined threshold and, thus, results in the detection of the beginning of the touch event. The transient decays as the force remains constant. A smaller downward transient is observable in response to the force adjustment between $t_2$ and $t_3$. The smaller downward transient is in the same direction as the initial downward transient, and may, thus, trigger the detection of a second touch event. A prominent upward transient is caused when the finger stops exerting pressure on the piezoelectric input device in the sensing region. In the method of FIG. 5, the upward transient results in the detection of the end of the touch event.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed:

1. A piezoelectric sensing module, comprising:
   a polyvinylidene fluoride (PVDF) piezoelectric film;
   a first electrode layer comprising a plurality of receiver electrodes arranged in a first pattern enabling a non-capacitive sensing of a position of an input object on a touch surface using the PVDF piezoelectric film; and
   a second electrode layer comprising a single solid, planar, unpatterned common electrode that completely spans to cover entirely a region that comprises the plurality of receiver electrodes,
   wherein the PVDF piezoelectric film is arranged between the first electrode layer and the second electrode layer, with the second electrode layer between the PVDF piezoelectric film and the touch surface.

2. The piezoelectric sensing module of claim 1, wherein the single solid, planar, unpatterned common electrode is one selected from a group consisting of a signal ground potential and a device ground potential.

3. The piezoelectric sensing module of claim 1, further comprising:
   a shielding layer, wherein the shielding layer is on a device ground potential.

4. The piezoelectric sensing module of claim 3, wherein the shielding layer at least partially encloses the PVDF piezoelectric film, the first electrode layer and the second electrode layer.

5. The piezoelectric sensing module of claim 3, wherein the shielding layer is between the first electrode layer and a display screen.

6. The piezoelectric sensing module of claim 1, further comprising a thermal layer arranged between the PVDF piezoelectric film and the touch surface,
   wherein the thermal layer is one selected from a group consisting of a thermally insulating material and a heat spreader material.

7. The piezoelectric sensing module of claim 1, wherein the plurality of receiver electrodes is directly disposed on the PVDF piezoelectric film.

8. The piezoelectric sensing module of claim 1, further comprising:
   a display screen disposed below the PVDF piezoelectric film.

9. The piezoelectric sensing module of claim 1, wherein a transparency of the PVDF piezoelectric film, the first electrode layer and the second electrode layer combined is at least 80%.

10. The piezoelectric sensing module of claim 1, wherein the touch surface provides a buttonless touch interface for one selected from a group consisting of an appliance, an automotive application and an industrial application.

11. A piezoelectric input device, comprising:
    a piezoelectric sensing module, comprising:
       a polyvinylidene fluoride (PVDF) piezoelectric film;
       a first electrode layer comprising a plurality of receiver electrodes arranged in a first pattern enabling a non-capacitive sensing of a position of an input object on a touch surface using the PVDF piezoelectric film,
       a second electrode layer comprising a single solid, planar, unpatterned common electrode that completely spans to cover entirely a region that comprises the plurality of receiver electrodes,
       wherein the PVDF piezoelectric film is arranged between the first electrode layer and the second electrode layer, with the second electrode layer between the PVDF piezoelectric film and the touch surface in a stack-up that is substantially transparent; and
    a processing system for determining the position of the input object based on resulting signals obtained from the plurality of receiver electrodes.

12. The piezoelectric input device of claim 11, wherein the processing system comprises:
    a charge integrator for determining a force signal from a resulting signal obtained at one of the plurality of receiver electrodes; and
    a low-pass filter for reducing noise on the force signal.

13. The piezoelectric input device of claim 11, wherein the piezoelectric sensing module further comprises a display screen disposed in the stack-up below the PVDF piezoelectric film.

14. The piezoelectric input device of claim 11, wherein the piezoelectric sensing module further comprises a shielding layer disposed between the touch surface and the first electrode layer.

15. A method for piezoelectric touch sensing, the method comprising:
    obtaining a first force signal from a piezoelectric sensing module comprising:
       a polyvinylidene fluoride (PVDF) piezoelectric film,
       a first electrode layer comprising a plurality of receiver electrodes arranged in a first pattern enabling a non-capacitive sensing of a position of an input object on a touch surface using the PVDF piezoelectric film, and
       a second electrode layer comprising a single solid, planar, unpatterned common electrode that completely spans to cover entirely a region that comprises the plurality of receiver electrodes, wherein the PVDF piezoelectric film is arranged between the first electrode layer and the second electrode layer, with the second electrode layer between the PVDF piezoelectric film and the touch surface;

based on determining that an amplitude of the first force signal is above a first predetermined threshold, registering a beginning of a touch event;

obtaining a second force signal; and based on determining that an amplitude of the second force signal is above a second predetermined threshold and that polarities of the first and second force signals are opposite, registering an end of the touch event.

16. The method of claim 15, further comprising:
determining a force signal baseline.

17. The method of claim 16, further comprising:
adjusting the first and second force signals for the force signal baseline.

18. The method of claim 15, wherein obtaining the first force signal comprises:
receiving a resulting signal from a receiver electrode disposed on the PVDF piezoelectric film; and
integrating the resulting signal to obtain the first force signal.

19. The method of claim 18, further comprising:
low-pass filtering the first force signal.

20. The method of claim 15, further comprising:
analog-to-digital converting the first force signal.

\* \* \* \* \*